United States Patent
Hallman et al.

[11] Patent Number: 5,512,420
[45] Date of Patent: Apr. 30, 1996

[54] WATERLESS PRESENSITIZED PLATE COMPRISING FOUR LAYERS

[75] Inventors: Robert W. Hallman, Palisades Park, N.J.; Suck-Ju Hong, Bronxville; Ken-ichi Shimazu, Briarcliff Manor, both of N.Y.

[73] Assignee: Sun Chemical Corporation, Fort Lee, N.J.

[21] Appl. No.: 392,456

[22] Filed: Feb. 22, 1995

[51] Int. Cl.$^6$ .............................. G03F 7/095; G03F 7/32; G03F 7/40

[52] U.S. Cl. ............. 430/303; 430/156; 430/166; 430/256; 430/258; 430/273.1; 430/328; 430/329; 430/945

[58] Field of Search .................. 430/156, 160, 430/166, 302, 303, 256, 258, 327, 328, 945, 329, 273

[56] References Cited

U.S. PATENT DOCUMENTS

| | | | |
|---|---|---|---|
| 3,567,445 | 3/1971 | Atkinson et al. | 430/302 |
| 3,894,873 | 7/1975 | Kobayashi et al. | 96/33 |
| 4,188,215 | 2/1980 | Sato et al. | 430/303 |
| 4,341,856 | 7/1982 | Toyama et al. | 430/156 |
| 4,342,820 | 8/1982 | Kinashi et al. | 430/11 |
| 5,069,999 | 12/1991 | Higashi et al. | 430/303 |
| 5,330,875 | 7/1994 | Adelman et al. | 430/166 |

*Primary Examiner*—John S. Y. Chu
*Attorney, Agent, or Firm*—Jack Matalon

[57] ABSTRACT

A camera speed lithographic plate precursor composition is used for the preparation of waterless, imaged printing plates. The plates comprise a solid substrate with a first layer of a photopolymerizable, oleophilic coating; a second layer of silicone rubber; a third protective film layer; and a top or fourth layer comprising a silver halide emulsion containing polymeric binders or keying agents.

1 Claim, No Drawings

WATERLESS PRESENSITIZED PLATE COMPRISING FOUR LAYERS

FIELD OF THE INVENTION

This invention relates to a camera speed, waterless lithographic printing plate useful for the digitally controlled production of printable images using a single development process. Plate dampening with an aqueous fountain solution as conventionally employed in prior art lithographic printing operations is obviated by use of the waterless printing plate of the invention. The composition of the plate readily lends itself to the integration and implementation of digitized, and other, imaging devices for printable image formation on the plate.

BACKGROUND OF THE INVENTION

In conventional planographic printing, a printing plate bearing as oleophilic, ink receptive image is first dampened with an aqueous fountain solution to prevent ink from wetting the hydrophilic, non-image bearing areas of the printing plate, after which an oil-based ink is rolled over the plate to selectively coat the now printable image. Conventional planographic printing has some difficulties inherent in having both an oleophilic ink and an aqueous fountain solution conjoined in the same press. First, the fountain solution applied to the printing plate flows back into the train of inking rollers on the press, causing emulsification of the ink. Secondly, it is difficult to maintain control of the delicate balance needed between the amount of ink and the amount of fountain solution applied to the printing plate. Consequently, the image fidelity and uniformity are difficult to maintain. Thirdly, the fountain solution tends to flow forward over the offset cylinder, moistening the copy paper and thereby causing its dimensional change. Fourthly, in the case where printing is imaged directly by electrophotography, the imaged printing plate must be subjected to an etching treatment and the printing operation becomes complicated.

Considerable effort has been applied in the industry directed toward the development of lithographic printing plates that may overcome some of the foregoing problems. A significant portion of that effort has been directed toward the development of planographic plates that do not need a fountain solution circulating in the printing apparatus to accomplish the printing function. These plates are referred to herein as waterless plates or dry plates. For these waterless plates, the circulating fountain solution is avoided by the discovery of various printing methods and plate compositions that do not rely on the induced hydrophilicity of a portion of the plate to distinguish an oleophilic image surface from a non-oleophilic non-image surface.

U.S. Pat. No. 4,259,905 teaches a waterless, contact speed planographic printing plate having an overlaying modified organopolysiloxane polymeric material layer. The plate exhibits enhanced printing endurance and produces prints of low background contamination.

U.S. Pat. No. 4,342,820 teaches a negative working waterless plate requiring no dampening water for use in negative work which comprises a base substrate, a light releasing photosensitive layer overlaying the base substrate and the silicone rubber layer overlaying the photosensitive layer. When the printing master plate is exposed through a negative film and then treated with a developer, only the silicone rubber layer overlaying the exposed photosensitive layer is removed, while the photosensitive layer remains as it is to form and image area. Dampening water is not required when printing is carried out.

U.S. Pat. No. 3,894,873 teaches a positive working waterless plate, comprises a base substrate, a light sensitive photoadhesive layer overlaying a base substrate and the silicone rubber layer overlaying the photoadhesive layer. When the printing master plate is exposed through a positive transparency and then treated with a developer, only the silicone rubber layer overlaying the unexposed photoadhesive layer is removed, while the photoadhesive layer remains as it is form an image area.

The waterless plates described in the foregoing patents are contact speed and not for camera speed. The term "camera speed" indicates that the light-sensitive material in question is photographically sensitive enough to permit imagewise exposure by focusing an original onto the light-sensitive layer of the printing plate forming material through an image-focusing lens system or other high sensitivity or digitized imaging devices. On the other hand, the term "contact speed" means that a light-sensitive material has a sensitivity such that it can be exposed through a negative or positive transparency placed in contact with it. Camera speed materials are photograpically sensitive to relatively low energy levels of light while relatively high light energy levels are needed to expose contact speed materials.

Most light-sensitive lithographic printing plate materials presently in commercial use are of contact speed sensitivity. Thus an image-bearing transparency of the original must be prepared before a printing plate can be made from a contact speed material. Consequently, the number of steps necessary to prepare the lithographic printing plates is considerably more than in the case in which no transparency is necessary.

The sensitizers typically used in light-sensitive lithographic printing plate materials are diazo compounds, i.e., o-quinonediazide compounds, or light-sensitive polymers like polyvinyl cinnamates. However, the photographic speed of these materials is too slow for the materials sensitized therewith to be of camera speed. Therein lies the reason for the preceding statement to the effect that most light sensitive lithographic printing plate making materials are of contact speed.

The most common sensitizer used in photographic materials of camera speed is silver halide. Light-sensitive lithographic printing plate materials having solely a silver halide emulsion layer as the image-forming layer have been produced. However, such plate materials are comparatively difficult to process and the printing life thereof in not long. Other light-sensitive lithographic printing plate composite materials of camera speed are known.

U.S. Pat. No. 3,567,445 teaches a presensitized lithographic printing plate with two different spectrally sensitive layers separated by a Novolak resin. The base layer is of the type used in a negative-working presensitized lithographic plate while the top layer is a silver halide emulsion layer.

U.S. Pat. No. 4,229,912 discloses a process for producing a lithographic printing plate using a plate containing two light sensitive layers, one of which is a gelatino-silver halide emulsion and the other is a non-silver halide layer. The patent teaches the use of a proteolytic enzyme to aid in the removal of the gelatino layer after imagewise exposure followed by exposure of the non-silver halide layer.

U.S. Pat. No. 4,283,478 teaches a light-sensitive printing plate forming material comprising a support having a hydrophilic surface provided with a layer of a positive-working light-sensitive resin composition capable of forming an oleophilic image, and a tannable light-sensitive silver halide emulsion layer containing a tanning-developing agent.

U.S. Pat. No. 4,341,856 teaches printing plates containing at least two light sensitive layers. Production of the final image-containing printing plate requires at least two exposure steps.

U.S. Pat. No. 5,330,875, incorporated herein by reference, teaches a process for producing negative and positive original images on a bilevel printing plate. The plate utilizes a contact speed (positive or negative) layer and a camera speed (negative) overlayer in a single development process to form a temporary imagemask which is exposed sequentially to either the negative or positive original with the resultant image subsequently developable in a single process or step.

The objective of the present invention is to provide a camera speed waterless lithographic printing plate wherein the need for conventional dampening with an aqueous fountain solution in the printing operation is obviated.

A further objective of the invention relates to the presentation of a waterless lithographic printing plate amenable to the production of positive originals using digital imaging devices in a single development process.

Yet further objectives of the invention include the method for the production of the waterless plate as well as the methods for image formation employing the waterless plate.

SUMMARY OF THE INVENTION

A camera speed lithographic printing plate precursor composition has been discovered that can be used for the preparation of imaged printing plates that do not require the use of aqueous fountain solutions in printing operations. The novel plates are effective in the reproduction of negative or positive images where the only liquids used in the printing process are oleophilic inks. The full invention comprehends not only the novel plate compositions but also the novel methods for their production and image-wise utilization.

The invention generally relates to a light-sensitive combination of materials for preparing a lithographic waterless printing plate precursor comprising a light sensitive silver halide layer and a layer of a positive or negative working light-sensitive resin composition. More particularly, a camera speed, waterless lithographic printing plate precursor has been discovered comprising a hydrophilic or non-hydrophilic solid substrate with a first layer on the substrate comprising a photopolymerizable, oleophilic coating catalytically responsive to direct actinic light exposure to produce an adhesive polymer. Atop the first layer is an actinic light transparent second layer comprising a solvent swellable, ink repellant silicone rubber. The rubber coating is covered by a third layer comprising a transparent, protective film. Finally, the precursor contains a fourth layer comprising a gelatino silver halide emulsion. The fourth emulsion also contains polymeric binders or keying agents to promote adhesion of the fourth layer to protective film of the third layer. The photopolymerizable coating layer can be negative working or positive working.

For one embodiment of the invention the silver halide emulsion layer or top layer is exposed to an actinic light having an intensity sufficient to expose the silver halide emulsion layer in order to form a latent image. Preferably a digitized light source is used. The latent image is then developed in a photographic developer and fixer to form a silver image on the protective layer. The plate is then exposed to an actinic light intensity sufficient to expose the photoadhesive layer. The protective film layer is removed and a developing liquid is applied to the silicone rubber layer. The developing liquid causes unique swelling of the silicone rubber layer which has not been bound to the photoadhesive layer in unexposed areas. Rubbing of the silicone rubber layer with developing liquid removes the image areas of silicone rubber layer that are not bound to photoadhesive layer. The effect provides an ink-receptive surface in the image areas while the non-image areas of the silicone rubber layer bound to photoadhesive layer comprise an ink repellent background area.

DETAILED DESCRIPTION OF THE INVENTION

I. Composition of the Waterless Lithographic Plate

The lithographic printing plate precursor of the invention is constructed of a substrate with four layers deposited on the substrate.

The Substrate Layer

The substrates which can be used in the instant invention are those having the mechanical strength needed to withstand the rigors of the printing process in which it is used. Solid substrates can be manufactured from metal, wood, film, or composite material. Since the printing process in which the plate is used is a waterless process, the substrate is not restricted to those having a hydrophilic surface as conventionally practiced. The substrate useful in the invention can have either a hydrophilic or hydrophobic surface as long as the surface can be adapted to retain the first, presensitized coating layer. An aluminum substrate is preferred in view of its mechanical strength and the familiarity of that substrate to the printing industry.

The First or Photoadhesive/Photosensitive Layer

The first layer of the plate may be a positive-working photosensitive layer or alternatively a negative-working photosensitive layer. In either case, the primary attributes of the negative or positive working coating of the first layer are sensitivity toward chemical conversion upon exposure to actinic light at contact speed and a capability to act as an adhesive bonding agent with the second silicone rubber layer.

i. Positive-Working Photosensitive Plate

The photoadhesive or photosensitive layer for a positive-working presensitized plate of the invention comprises an ethylenically unsaturated photopolymerizable monomer or oligomer having a boiling point above 100° C. derived from monoalcohols or monoamines having less than 30 carbon atoms or polyalcohols or polyamines having less than 80 carbon atoms, a photoinitiator and, if necessary, an inhibitor of heat polymerization, polymeric materials or an inorganic powder. Examples of useful coatings are listed in U.S. Pat. No. 3,894,873. The unsaturated monomers or oligomers are acrylates or methacrylates such as dimethylaminoethyl methacrylate, polyethylene glycol dimethacrylate, 3-chloro-2-hydroxypropyl methacrylate, N,N,N',N' tertrakis-2-hydroxy-3-methacryloyloxy propylxylylenediamine, hydroxyacetoneacrylamide, or N-methoxymethylacrylamide.

Examples of photoinitiators include benzophenone, Michler's ketone, xanthone, benzoin, benzoin methyl ether, benzoin isopropyl ether, dibenzyl disulfide and uranyl nitrate.

Examples of polymeric materials include unsaturated polyester resins composed of units selected from ethylene oxide, propylene oxide, phthalic acid, bisphenol-A, maleic anhydride and fumaric acid, polyvinyl acetate, polybutylmethacrylate, polyoctylmethacrylate, polyethylene oxide, and soluble nylon copolymers.

In order to maintain photosensitivity of the presensitized plate and prolong the storable period very small amounts of heat polymerization inhibitor are preferably added to the photoadhesive layer composition. Examples of such inhibitors are hydroquinone, phenothiazine, 2,4-dinitrophenol and triphenylmethane.

If necessary, other additives may be included in the photoadhesive layer to make it solid enough to support the silicone rubber overlayer parallel with the base layer. The resulting plate shows a high scratch resistance and excellent storability.

ii. Negative-Working Photosensitive Plate

The alternative negative-working photosensitive presensitized plate of the invention comprises the quinonediazides usually employed for conventional positive working presensitized plates, wipe-on plates or photoresist. These include the ester obtained from benzoquinone-1,2-diazide sulfonates or naphthoquinone-1,2-diazide sulfonates and polyhydroxy compounds, e.g. benzoquinone-1,2-diazide sulfochloride with polyhydroxy phenyl, the ester from naphthoquinone-1,2-diazide sulfochloride and pyrogallol acetone resin, the ester from naphthoquinone-1,2-diazide sulfochloride and phenol-formaldehyde novolak resin; or complexes of diazonium compounds and inorganic or organic acids, e.g., a photosensitive complex of diazodiphenylamine and phosphotungstic acid. The preferred components are selected from the group consisting of a reaction product of a quinonediazide with a polyfunctional compound, quinonediazide urethanized with a monoisocyanate, an esterified quinonediazide, an amidized quinonediazide, a quinonediazide graft polymerized with a vinyl monomer, so that the photosensitive layer is substantially insoluble in a developer.

The polyfunctional compounds employed as crosslinking agents are polyisocyanate compounds, e.g., paraphenylene diisocyanate, 2,4 or 2,6-toluene diisocyanate, 4,4'-diphenylmethane diisocynate, hexamethylene diisocyanate, isophorone diisocyanate, or adducts thereof, and polyepoxy compounds. e.g. polyethylene glycol diglycidyl ethers, polypropylene glycol diglycidyl ethers, bisphenol A diglycidyl ether, and trimethylolpropane triglycidyl ether. It is necessary that the curing operation with these crosslinking agents be carried out under conditions under which the photosensitive substance will not lose its photosensitivity, usually at a temperature not higher than 126° C. A catalyst may be added if necessary. The most preferred composition is a condensation product of quinonediazide naphthoquinone-1,2-diazide-sulfonate with phenol-formaldehyde novolak resin. Examples of useful coatings are listed in U.S. Pat. No. 4,342,820.

The negative photosensitive layer is capable of releasing the silicone rubber layer and constituting an image area in a selected area to be ,exposed to the actinic light so that the silicone rubber layer can be removed in the exposed image by a developer.

The Second or Silicone Rubber Layer

The silicone rubber layer of this invention comprises crosslinked diorganosiloxane obtained by curing silicone gums. Essentially, they are elastomers of high-molecular weight, about 400,000 to 800,000 formed by crosslinked linear diorganopolysiloxanes, preferably dimethylsiloxane. Silicone rubbers suitable for use in the present invention are well known and are listed in U.S. Pat. Nos. 3,894,873 and 4,342,820.

The Third or Transparent Film Layer

The transparent film may be thinner than 10 mils (preferably thinner than 4 mils) to obtain good image fidelity. However, the film should be capable of providing an effective barrier to atmospheric oxygen in order to protect the reactivity of the photosensitive first layer. Representative examples of such a transparent film include polyethylene, polypropylene, polyvinyl chloride, polyvinyl acetate, polyvinyl alcohol, polystyrene, polyethylene terephthalate, polycarbonate, cellulose triacetate, polyester (Mylar by Dupont) etc.

In the present invention the preferred transparent films are polyolefin films such as polyethylene and polypropylene which have been treated to enhance their ability to adhesively bond with other films. However, an overriding characteristic of the preferred films and any film used as a third layer is transparency to actinic light. To assure UV transparency, the films should contain a very minimum amount of conjugated olefinic unsaturated bonding, preferably nonconjugated olefinic unsaturation. It is well known that UV absorbtivity is enhanced in a molecule to the extent that it contains conjugated olefinic unsaturation so that films containing a significant amount of olefinic unsaturation would not be sufficiently transparent to ultraviolet light for use in the present invention.

The Fourth or Silver Halide Layer

The top layer or coating of the lithographic plates precursor of the invention comprises any type of gelatino silver halide emulsion depending on the original to be produced, with the important exception that it is distinguished over prior art emulsions in that it contains one or more special keying agents to facilitate adhesion between the emulsion layer and the third layer comprising the transparent film. Silver halide includes silver chloride, silver bromide, silver iodide and mixtures thereof as conventionally employed in the art. The average silver halide grain diameter is preferably between 0.01 and 5u.

In order to provide a suitable or desired sensitivity to the silver halide, the grains thereof can be subject to chemical sensitization, e.g., sulfur sensitization, reduction sensitization, sensitization using salts of nobel metals such as Ir, Rh, Pt. etc., or spectral sensitization using sensitizing dyes. Silver halides of the latent surface image type and inner latent image type can be used. The silver halide emulsion generally contains various additives as known in the art. The gelatino silver halide light sensitive emulsion layer is provided so that the dry weight is about 1 to 10 grams per square meter (g/m$^2$), preferably from 3 to 8 g/m$^2$.

The silver halide layer of the invention also contains one or more particular keying agents or adhesion promoting agents which induce silver halide emulsion to adhere to the thin transparent film layer. The keying agents includes water-borne latex emulsions in an amount consisting of 10–35 weight percent, based on gelatin. The preferred amount is between 15–25 weight percent based on gelatin. The examples of water-borne latex includes polymethacrylamide, polyvinyl alcohol, acrylic acid polymers, polyamines, polyurethane and polyamides. The preferred polyacrylic acid latex emulsions are from polymethacrylic, polyacrylic and methylmethacrylate/methacrylic acid copolymers. Such polymers are described in the U.S. Pat. No. 4,283,478. In the present invention the most preferred water-borne latex for promoting adhesion on the protective transparent film are from butyl acrylate/methyl methacrylate and vinyl acetate/butyl acrylate copolymers.

Ordinarily, silver halide emulsion would not adhere to the transparent film layer of this invention. A suitable silver halide emulsion layer of this invention requires good film forming properties and flexibility and remain adhered to the transparent film layer during storage and preimaging operations. However, the keying agents, while promoting film bonding, do not prevent removal of unexposed emulsion from the film layer by the developer after imagewise exposure of the silver halide layer. Accordingly, the silver halide emulsion layer of this invention is specially formulated to contain a keying agent or an adhesion promoter which allows silver halide emulsion to adhere to the thin transparent film. The keying agents or adhesion promoters are selected from group of polymers and copolymers of poly-(methylmethacrylate/n-butyl methacrylate/methacrylic acid), poly(methylmethacrylate/methacrylic acid), poly(ethylmethacrylate), poly(isobutyl methacrylate), poly(methylmethacrylate) and poly(n-butyl/isobutyl acrylate) available commercially from DuPont, Wilmington, Del. under the trade name Elvacite; also selected from ethylene-vinyl acetate copolymer latices available from National Starch and Chemical Co, N.J. under the trade name Duroset E-200 and latex emulsions of butyl acrylate/methyl methacrylate and vinyl acetate/butyl acrylate copolymers available from Union Carbide, N.J. under the trade name UCAR 441 and 447 water borne acrylic latex emulsions. Compounds listed as hardening agents in U.S. Pat. No. 4,283,478 may also be used in the present inventions. The most preferred are butyl acrylate/methyl methacrylate and vinyl acetate/butyl acrylate copolymers which have glass transition temperature (Tg) in the range of 20°–30° C. These two most preferred latex emulsions provide good flexibility and film forming properties when mixed with the gelatin of the silver halide emulsion according to the method describe below.

The resin for keying agents such as poly(methylmethacrylate/n-butyl methacrylate/methacrylic acid) Elvacite 2016 available from DuPont is first pre-dissolved in an organic solvent selected from a group of aliphatic ketones, preferably methyl ethyl ketone. It is then finely dispersed in a silver halide emulsion containing gelatin at 30°–40° C. with vigorous stirring or it is ball-milled in water with surfactant to form a water-borne latex emulsions. The water-borne latex emulsion can also be prepared in the conventional method as known in the common art. In the present invention, preferred water borne latex emulsion for promoting adhesion on the thin transparent film are from butyl acrylate/methyl methacrylate and vinyl acetate/butyl acrylate copolymers at 10–35 weight percent based on gelatin, preferably between 15–25 weight percent based on gelatin.

II. The Imaging Process

In the instant invention a digitally controlled laser is a preferred method for imagewise of the silver halide emulsion layer of the plate. It is known that photographic processes of making positive and negative film originals is time consuming and causes uncontrolled variations in the process. Facilities and equipment adequate to support the process are required. To avoid these limitations, electronic alternatives adaptable to plateimaging have been developed that result in better control of platemaking, including digital direct platemaking systems and especially systems coupled to laser imaging devices. For digital platemaking, the textual and graphics information stored in desk top publishing or digital data storage systems can be modified on the computer before digitizing onto the plate. The high speed of text printing from the resultant digitized plate provides considerable productivity improvements over the conventional mode of platemaking. Hence, in the present invention digitally controlled image production is preferred using a laser beam.

The method for image production on waterless lithographic printing plates using the photosensitive lithographic printing plate precursor of the present invention is depicted in the following steps:

First, the photosensitive layer containing silver halide emulsion is imagewise exposed to light at camera speed to form a latent image in the silver halide layer. The silver halide layer is then treated with known developer and fixing solution to develop and fix the latent image. The developed images serve as a mask for the subsequent exposure step. An example of a developer and a fixer which can be used in the present invention is known in the art as disclosed in U.S. Pat. No. 4,229,912.

Following imagewise exposure and development, the plate is given an overall exposure to actinic light of relatively high energy level, which .light impinges on the first, contact speed photosentive layer through the transparent intervening two layers of protective film and silicone rubber. For a positive worrying first layer, exposure results in the polymerization of those parts of photosensitive layer corresponding to the unmasked, non-image areas of the plate. The effect of the polymerization is to form an adhesive polymer which bonds firmly to the silicone rubber layer, but only in non-image areas. The photoadhesive layer in the unexposed image area remains unpolymerized and does not bond to the silicone rubber layer.

Following the overall exposure of the plate to actinic light of contact speed energy content, the protective film layer is physically removed to permit the treatment or development of the silicone rubber layer. That layer is treated, preferably by soaking, with a developing liquid which is capable of swelling the silicone rubber. Though the silicone rubber layer of the plate is very thick, the portion of the silicone layer over the unexposed part of the photosensitive layer that corresponds to the image area is not adhesively bound to the photosensitive layer is easily removed, preferably by swabbing with cotton, to reveal a sharp, oleophilic image area of the photosensitive layer that underlies the part of the silicone layer that was removed. The silicone rubber layer in the non-image areas remains bound to the photoadhesive underlayer and is not removed from the plate.

The developing liquids for positive working waterless plate are those which can be absorbed by the cured silicone rubber and swell the said layer without affecting or weakening the bonding of the photosensitive layer to the silicone rubber in the image area. The most useful developing liquids include isoparaffin or linear hydrocarbon, or a mixture having those major components. These liquids are commercially and economically available from the fractional distillation products of petroleum. The fractions having lower boiling point are more absorbed by the silicone rubber, which is more swollen and consequently can be removed more easily then those treated by the fraction of higher boiling point. Thus gasoline is one of the most useful, convenient and economical developing liquids. These hydrocarbons do not usually affect and dissolve even the unhardened photoadhesive layer which remains on the plate surface after the removal of the silicone rubber layer in the image area.

Developing liquids for negative working waterless plate are those which are capable of swelling silicone rubber. These are aliphatic hydrocarbons (e.g. hexane, heptane, gasoline, kerosene), aromatic hydrocarbons (e.g. toluene, xylene), or halogenated hydrocarbons (e.g. trichloroethane) and the following polar solvents: alcohols (e.g. methanol, ethanol), ethers (e.g. ethyl cellosolve, dioxane; ketones (e.g. acetone, methyl ethyl ketone; esters (e.g. ethyl acetate, cellosolve acetate).

III. The Printing Process

During printing operations the exposed surface of the oleophilic photoadhesive layer corresponding to the image area accepts ink from the inking rollers. The silicone rubber background area that remains bound to the photosensitive layer is not wettable by oil-based inks. Therefore, ink is not removed from the rollers by the silicone rubber and they remain a non-printing part of the plate.

Since the resulting plate has a thick layer of silicone rubber which is firmly bound to the photo polymerized underlayer in the non-imaged background area, this plate has high scratch resistance and is capable of printing more than one hundred thousand clean copies in the absence of dampening.

Overall, the foregoing process uniquely allows the production of printing plates by the image-wise exposure of the plate precursors to objects at camera speed while the plate precursor composition also directly allows the production of a printing plate that is amenable to waterless printing operations.

IV. Waterless Lithographic Plate Production Process

The method of producing the plate of the invention is depicted as follows:

A layer of photoadhesive composition is applied to a flexible substrate by a known coating apparatus such as reverse roll coater, blade coater, mayer bar knife, knife, etc. A silicone gum composition is applied over the photoadhesive layer by coating a silicone solution or by transferring a silicone film previously prepared over a releasable substrate. The silicone layer is cured to provide an elastic silicone rubber layer. When the silicone solution is coated over the photoadhesive layer the solvents of the solution should not damage the photoadhesive layer. A thin transparent protecting film is applied on the silicone rubber surface by known lamination techniques. The protective film prevents the diffusion of atmospheric oxygen into the photoadhesive layer. Finally, a silver halide emulsion layer is applied over the transparent protective film by known coating apparatus.

The following Examples 1–3 (Negative Emulsion on Positive Plate) and Example 4 (Negative Emulsion on Negative Plate) are provided to illustrate various non-limiting embodiments of the present Invention:

Negative Emulsion on Positive Plate

Example 1

A positive working waterless plate available from Toray Industries, Inc., Tokyo, Japan with the commercial designation "TAP" was overcoated with Polychrome's laser scanner negative silver halide emulsion (PC465) containing the adhesion promoter. The keying agent is available from Union Carbide as UCAR 441, an acrylic latex emulsion containing 45 weight percent of butyl acrylate/methyl methacrylate copolymer. The keying agent was finely dispersed in a silver halide emulsion containing gelatin at 30°–40° C. with vigorous stirring. The weight of copolymer is 15–25% based on gelatin. The plate is then dry by conventional method. The gelatino silver halide light sensitive emulsion layer has a dry weight of about four grams per square meter. The plate was digitally exposed at 5 uJ/CM$^2$ on a Gerber Scientific blue argon-ion laser scanner (LE 55) with a negative original to form a latent image on the silver halide emulsion layer. The plate was then processed in a rapid access developer (Polychrome PC126) and Polychrome fixer PF 200 to form a silver image on the protective film. The plate was then given an overall exposure of actinic (UV) light at 400 mj/cm$^2$ to expose the photoadhesive first layer. The protective film was then peeled off and the plate was developed with Toray's positive developer HP-7N and silicone rubber in the unexposed areas removed by brushing. The unexposed areas of the photosensitive layer comprise ink-receptive image areas, whereas the remaining silicone rubber layer comprise ink-repellent areas. The plate exhibits an excellent positive image from a negative original and can be run on a press to produce over 100,000 copies. By rolling up the plates on the press, the background becomes clean of ink while the image areas accept ink. Following this procedure, the plate is ready for printing.

Example 2

A positive working waterless plate from Toray Industries, Tokyo, Japan, with the commercial designation "TAP" was overcoated with Polychrome's laser scanner negative silver halide emulsion (PC465) containing the adhesion promoter (keying agent). The keying agent is available from Union Carbide as UCAR 447, an acrylic latex emulsion containing 60 weight percent of vinyl acetate/butyl acetate copolymer. The keying agent was finely dispersed in a silver halide emulsion containing gelatin at 30°–40° C. with vigorous stirring. The weight of copolymer is 15–25% based on gelatin. The plate is then dry by conventional method. The gelatino silver halide light sensitive emulsion layer has a dry weight of about four grams per square meter. The plate was then digitized and processes as in Example 1.

Example 3

A positive working waterless plate from Toray Industries, Tokyo, Japan, with the commercial designation "TAP" was overcoated with Polychrome's laser scanner negative silver halide emulsion (PC465) containing the adhesion promoter (keying agent). The keying agent is available from DuPont as Elvacite 2616 resin, an acrylic copolymer of methyl methacrylate/n-butyl methacrylate/methacrylic acid. It was dissolved in methyl ethyl ketone at 8% and was then finely dispersed in a silver halide emulsion containing gelatin at 30°–40° C. with vigorous stirring. The weight of copolymer is 15–25% based on gelatin. The plate is then dry by conventional method. The gelatino silver halide light sensitive emulsion layer has a dry weight of about four grams per square meter. The plate was then digitized and processes as in Example 1.

Negative Emulsion on Negative Plate

Example 4

Toray's waterless plate (TAN) was overcoated with Polychrome's laser scanner negative silver halide emulsion (PC- 465) containing adhesion promoter as in Example 1. The plate was exposed on Gerber Crescent 42 plate setter using a positive original to form a latent image on the silver halide emulsion layer. The plate was then processed in a rapid access developer (PC-126) and fixer PF 200 to form a silver image on the protective film. The plate was then given an overall exposure of actinic light at 500 mj/cm$^2$ to expose the photoadhesive first layer. The protective film was then peeled off and Toray's pretreatment solution (PTS-1) was applied to the plate to de-sensitize the plate and to strengthen the link between the silicone rubber and photosensitive layer in unexposed areas. The silicone rubber in the exposed area is brushed off. The photosensitive layer in the exposed areas provides an ink-receptive image, whereas the remaining silicone rubber layer in unexposed areas provides an ink-repellent background area. By rolling up the plate on the press, the background becomes clean of ink, whereas the image areas accept ink; then the plate is ready for printing 100,000 copies.

What is claimed is:

1. A process for exposing a waterless presensitized plate to an image, said process comprising:

contacting said plate with a computer controlled laser beam, said beam containing digitized information corresponding to said image, wherein said plate comprises a hydrophilic or non-hydrophilic solid substrate; a first layer on said substrate comprising an oleophilic photoadhesive coating containing an ethylenically unsaturated photopolymerizable monomer or oligomer having the property of adhesively polymerizing when exposed to actinic light or a photoreleasable adhesive coating containing quinonediazides having solubilizable properties upon exposure to actinic light;

an actinic light transparent second layer comprising a solvent swellable, ink repellant silicone rubber;

a third layer comprising a polymeric protective film essentially transparent to actinic light; and a fourth layer comprising a gelatino silver halide emulsion, said emulsion containing polymeric binders or keying agents to promote adhesion of said fourth layer to said protective film.

* * * * *